(12) United States Patent
Lee et al.

(10) Patent No.: US 12,211,773 B2
(45) Date of Patent: Jan. 28, 2025

(54) INTEGRATED ANTENNA-IN-PACKAGE STRUCTURE

(71) Applicant: JCET STATS ChipPAC Korea Limited, Incheon (KR)

(72) Inventors: SeungHyun Lee, Incheon (KR); HeeSoo Lee, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 258 days.

(21) Appl. No.: 17/932,592

(22) Filed: Sep. 15, 2022

(65) Prior Publication Data

US 2024/0096770 A1    Mar. 21, 2024

(51) Int. Cl.
*H01L 23/498*  (2006.01)
*H01L 23/552*  (2006.01)
*H01L 23/58*  (2006.01)
*H01L 25/16*  (2023.01)
*H01Q 9/04*  (2006.01)
*H01R 12/71*  (2011.01)

(52) U.S. Cl.
CPC ...... *H01L 23/49805* (2013.01); *H01L 23/552* (2013.01); *H01L 23/58* (2013.01); *H01L 25/16* (2013.01); *H01Q 9/0485* (2013.01); *H01R 12/716* (2013.01)

(58) Field of Classification Search
CPC .......... H05K 1/117; H05K 1/14; H05K 1/141; H05K 1/142; H05K 1/144
See application file for complete search history.

(56) References Cited

U.S. PATENT DOCUMENTS

| | | |
|---|---|---|
| 8,344,842 B1 | 1/2013 | Luzanov |
| 10,887,994 B2* | 1/2021 | Kim ........................ H05K 1/181 |
| 10,931,000 B1 | 2/2021 | Kang et al. |
| 2010/0331050 A1* | 12/2010 | Tahk ................... H01R 13/2442 455/566 |
| 2012/0106112 A1 | 5/2012 | Knies et al. |
| 2020/0098699 A1* | 3/2020 | Ryu ..................... H01L 23/5383 |
| 2020/0403298 A1* | 12/2020 | Vincent ................... H01L 23/66 |
| 2021/0359415 A1* | 11/2021 | Takaki ................... H01Q 21/28 |
| 2021/0366838 A1 | 11/2021 | Han et al. |
| 2022/0037763 A1* | 2/2022 | Kim ................... H01Q 21/0087 |

* cited by examiner

*Primary Examiner* — Hoa C Nguyen

(74) *Attorney, Agent, or Firm* — Brian M. Kaufman; Robert D. Atkins; PATENT LAW GROUP: Atkins & Associates, P.C.

(57) ABSTRACT

A semiconductor device includes a first substrate. An electrical component is disposed over the first substrate. A board-to-board connector is disposed over the first substrate. An encapsulant is deposited over the first substrate and electrical component to form a subpackage. The board-to-board connector remains exposed from the encapsulant. A contact pad is formed on a side surface of the subpackage. The subpackage is mounted to an antenna through the contact pad.

25 Claims, 10 Drawing Sheets

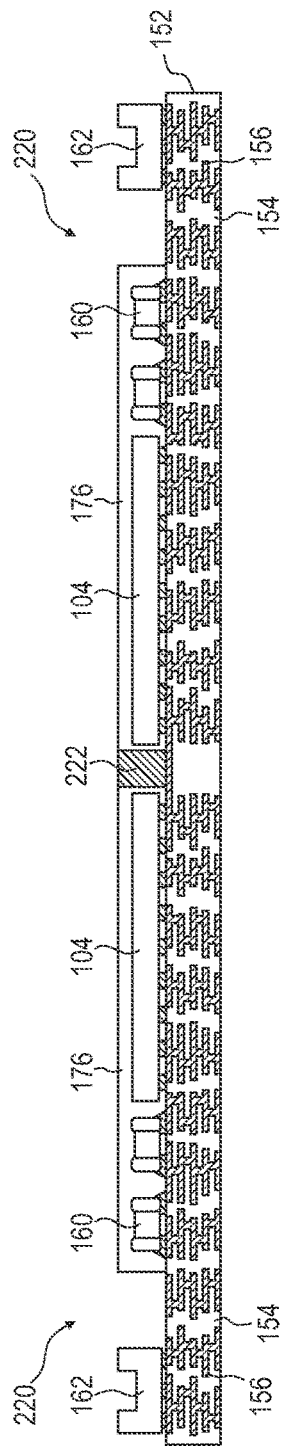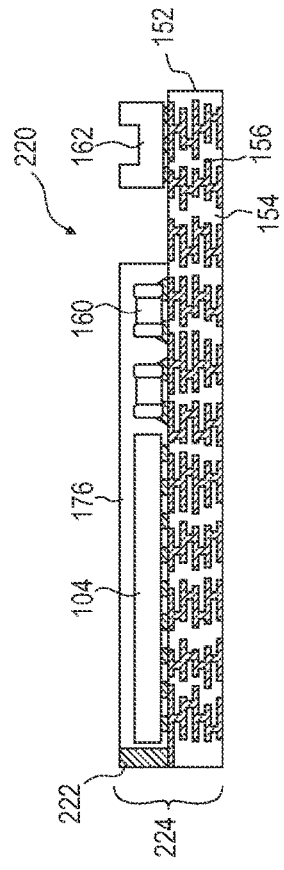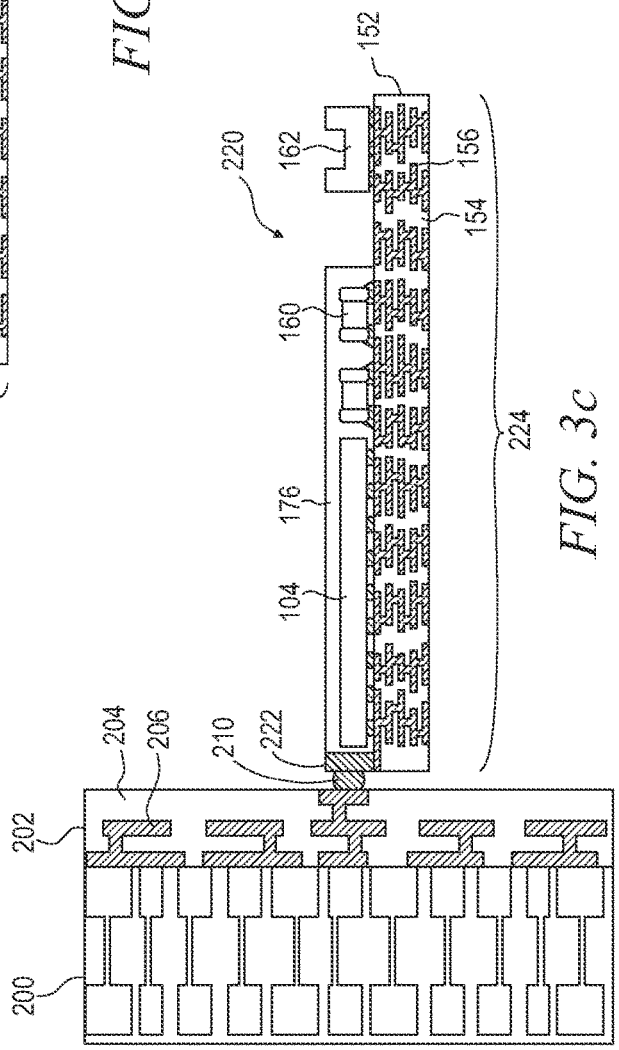
FIG. 3a
FIG. 3b
FIG. 3c

INTEGRATED ANTENNA-IN-PACKAGE
STRUCTURE

FIELD OF THE INVENTION

The present invention relates in general to semiconductor devices and, more particularly, to a semiconductor device and methods of making and using an integrated antenna-in-package (AiP) structure.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are continually utilizing more and more advanced wireless communication technologies and protocols. Newer 5G communication chips utilize a dielectric resonator antenna (DRA) and other advanced antenna types to communicate at higher 5G frequencies. These advanced antennae are commonly attached to semiconductor packages using a flexible substrate that allows the antenna to be oriented at various angles relative to the package. However, the manufacturing process utilizing flexible substrates is expensive and complex. Therefore, a need exists for an integrated AiP structure.

BRIEF DESCRIPTION OF THE DRAWINGS

FIGS. 3a-3c illustrate an alternative embodiment;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "semiconductor die" and "die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
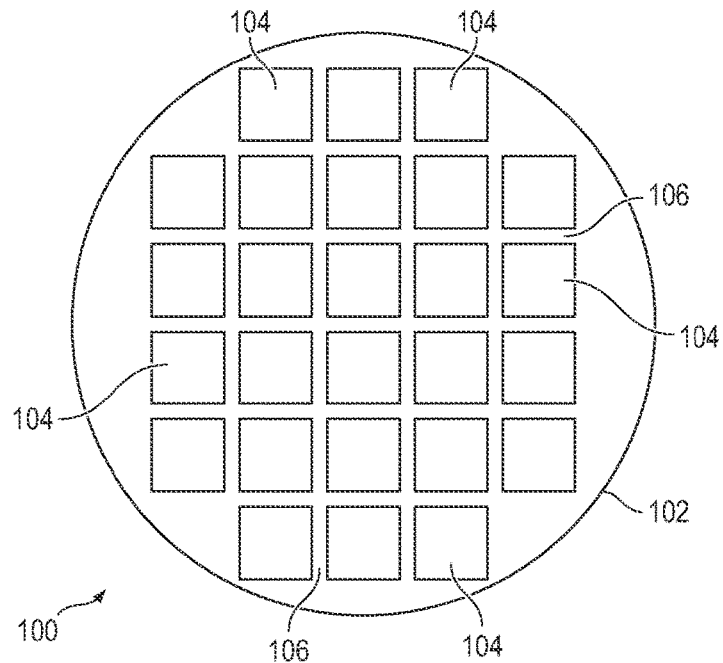
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
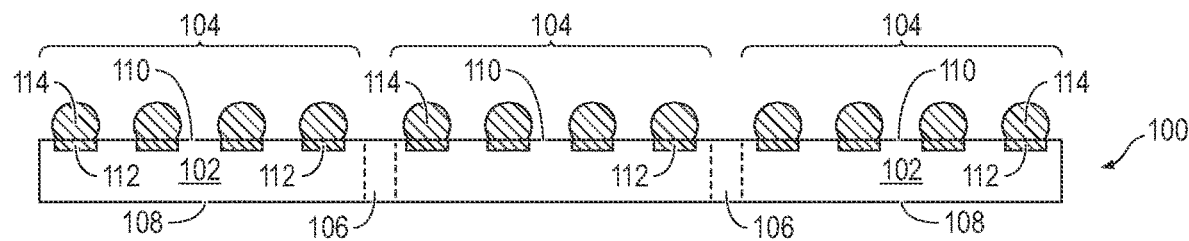

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
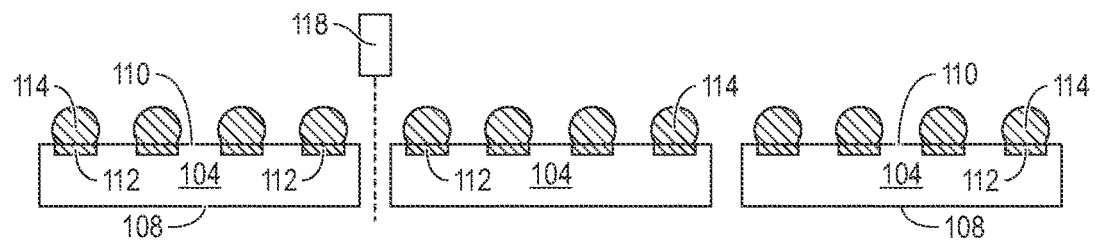

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
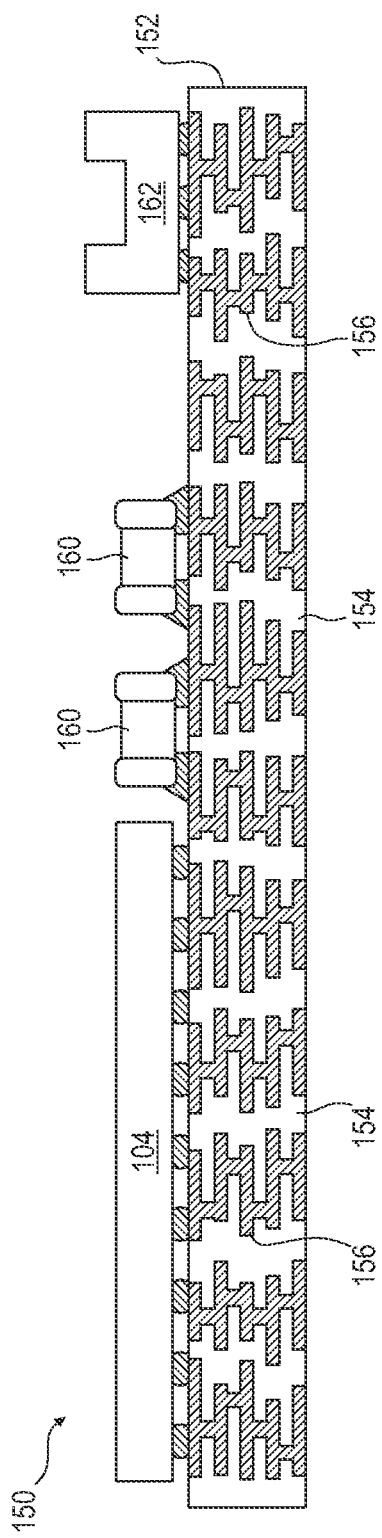
FIGS. 2a-2j illustrate forming an integrated AiP.

FIGS. 2a-2j illustrate a process of forming an integrated antenna-in-package (AiP) 150. FIG. 2a is a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Forming AiP 150 begins with mounting semiconductor die 104, discrete components 160, board-to-board (B2B) connector 162, other discrete active or passive components, additional semiconductor die, and any other desired components to substrate 152. Any number, type, and combination of semiconductor die and other electrical components can be used to make AiP 150. In one embodiment, semiconductor die 104 is a 5G transceiver and discrete components 160 form a radio frequency (RF) filter.

Solder paste is used to electrically and mechanically couple discrete component 160 and B2B connector 162 to conductive layer 156. Any combination of discrete active and passive components can be mounted as desired, e.g., to implement a radio frequency (RF) filter. B2B connector 162 is used to attach another PCB, a ribbon cable, or another electrical system to AiP 150 to allow other packages to communicate with, and utilize the functionality of, semiconductor die 104. Semiconductor die 104 is connected to B2B connector 162 and discrete components 160 through conductive layer 156.

Figure 2B:
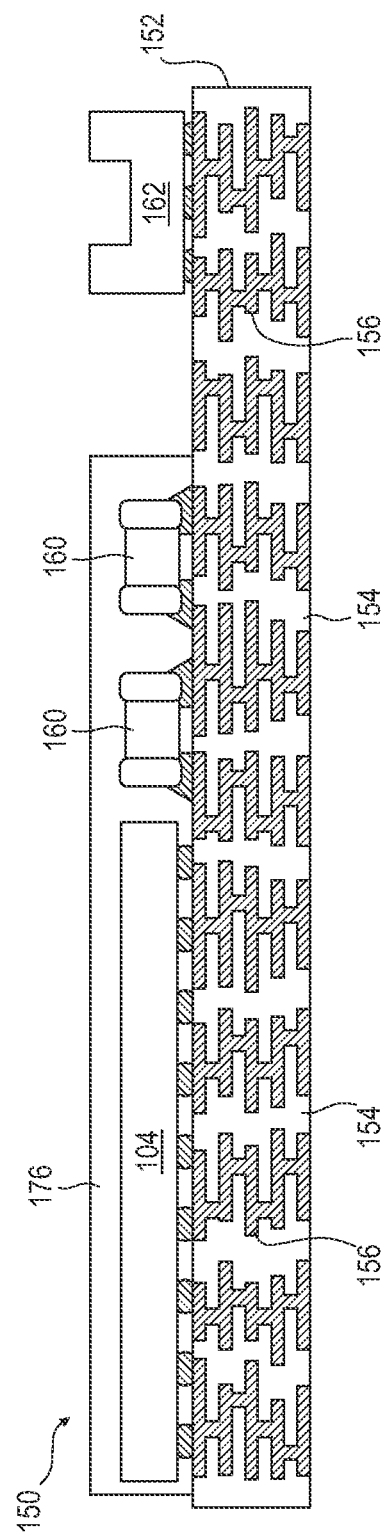

In FIG. 2b, an encapsulant or molding compound 176 is deposited over substrate 152, covering top and side surfaces of semiconductor die 104 and discrete components 160. Encapsulant 176 also extends under semiconductor die 104 and discrete components 160 between the components and substrate 152. In other embodiments, a separate mold underfill (MUF) is used instead.

Encapsulant 176 is an electrically insulating material deposited using a paste printing, compressive molding, transfer molding, liquid encapsulant molding, vacuum lamination, spin coating, or other suitable application process. Encapsulant 176 can be polymer composite material, such as an epoxy resin, epoxy acrylate, or polymer with or without a filler. Encapsulant 176 is non-conductive and environmentally protects the semiconductor device from external elements and contaminants.

B2B connector 162 remains outside of encapsulant 176 by utilizing a lid or mask that can be removed after encapsulation or by using a mold that protects the B2B connector within a non-molding compartment. Encapsulant 176 is typically deposited with substrate 152 remaining as a larger panel with multiple AiP 150 being formed at once. The larger panel of substrate 152 and encapsulant 176 is then singulated after manufacturing is complete.

Figure 2C:
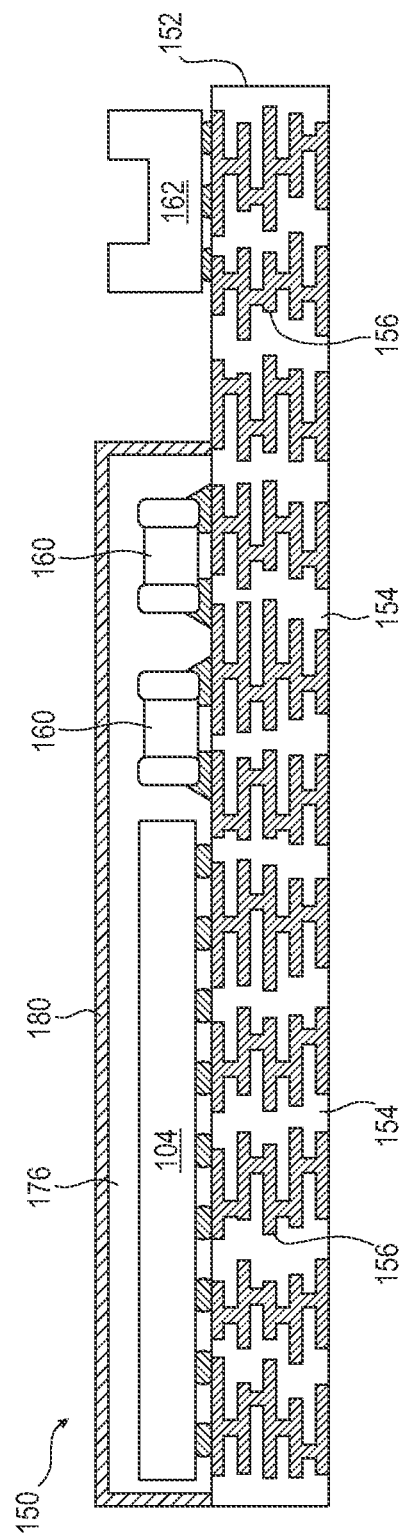

In FIG. 2c, a conductive material is optionally sputtered over AiP 150 to form a conductive shielding layer 180. Shielding layer 180 is formed using any suitable metal deposition technique, e.g., PVD, CVD, other sputtering methods, spraying, or plating. The sputtered material can be copper, steel, aluminum, gold, combinations thereof, or any other suitable conductive material. In some embodiments, shielding layer 180 can be made by sputtering on multiple layers of differing material, e.g., stainless steel-copper-stainless steel or titanium-copper.

Shielding layer 180 reduces EMI between the components of AiP 150 and other nearby electronic devices. Shielding layer 180 is optionally connected to a ground voltage node through conductive layers 156 to improve EMI reduction. Shielding layer 180 can be connected to conductive layer 156 by sputtering the shielding layer onto an exposed side surface of substrate 152 where the conductive layer is exposed, or onto a contact pad of conductive layer 156 on the top surface of substrate 152. B2B connector 162 remains outside of shielding layer 180 by sputtering the shielding layer while the B2B connector is protected by a lid or can. Shielding layer 180 is formed directly on and covers top and side surfaces of encapsulant 176.

Figure 2D:
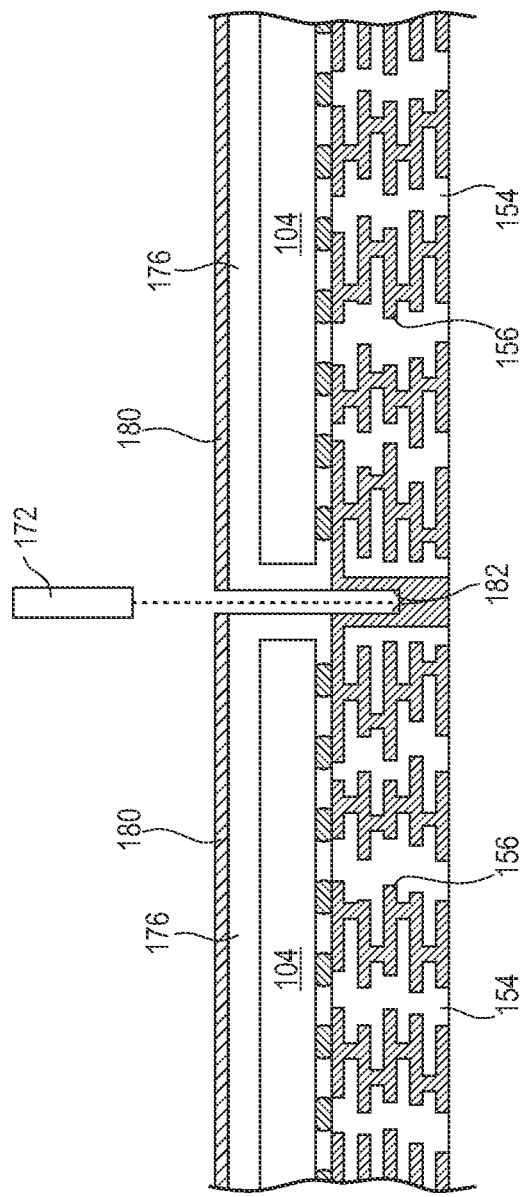

FIG. 2d shows a view perpendicular to FIG. 2c, illustrating how contact pads 182 are formed over a side surface of substrate 152. Contact pads 182 are formed as a conductive via through insulating layers 154, or as a series of stacked conductive vias and conductive layers. Singulating through substrate 152 using, e.g., a laser cutting tool as illustrated, exposes contact pad 182 at a side surface of the substrate.

Figure 2E:
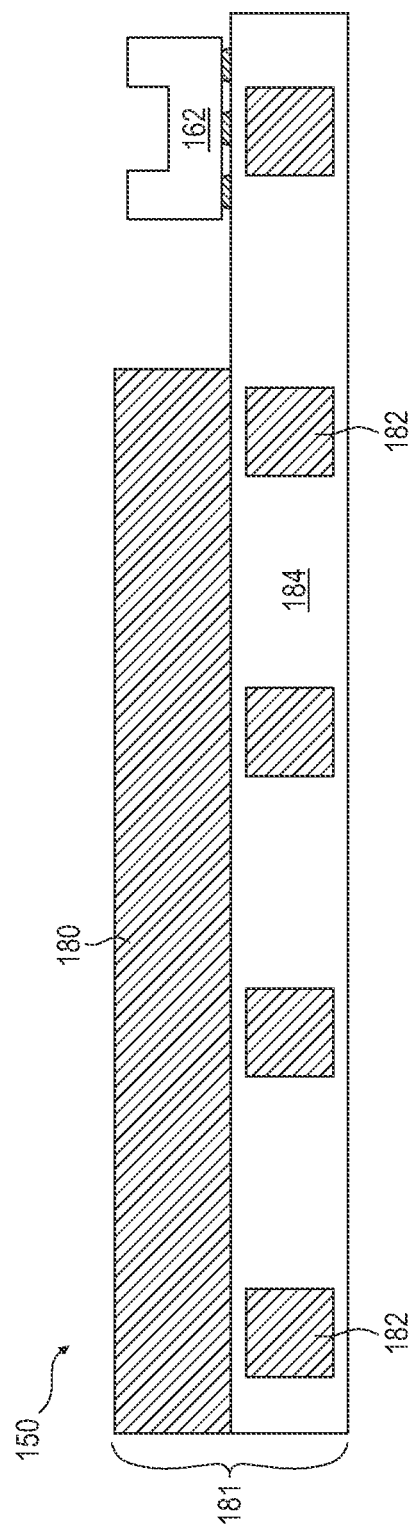

FIG. 2e shows an external view of a completed subpackage 181 from the same angle as the cross-section of FIG. 2c, illustrating contact pads 182 formed on side surface 184 of substrate 152. Subpackage 181 includes substrate 152, encapsulated semiconductor die 104, any other desired electrical components, and B2B connector 162.

Figure 2F:
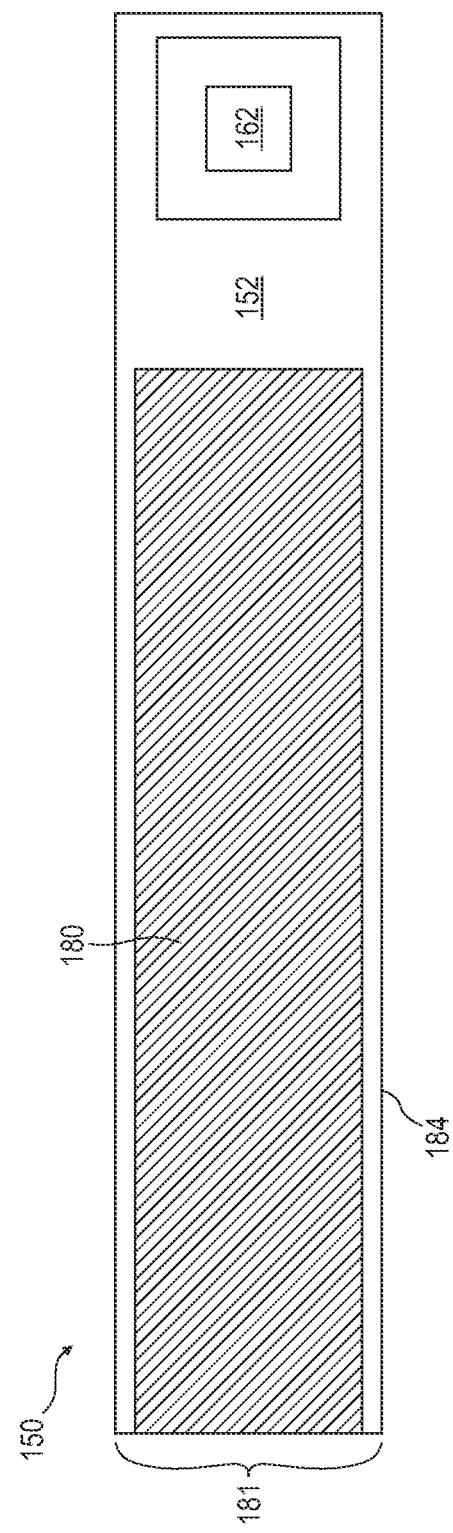

Contact pads 182 are formed as part of conductive layers 156 in one embodiment, e.g., as one or more conductive vias and conductive layers that are exposed as part of the process of singulating substrate 152. In another embodiment, contact pads 182 are formed as part of shielding layer 180 directly on exposed portions of conductive layers 156 and then chemical or laser etched to separate the contact pads from the shielding layer. In a third embodiment, contact pads 182 are formed separately from conductive layers 156 and shielding layer 180 in an independent process. FIG. 2f shows a top-down view of AiP 150. Having contact pads on edge 184 allows subpackage 181 to be mounted to another substrate oriented perpendicularly, i.e., standing up on edge 184.

Figure 2G:
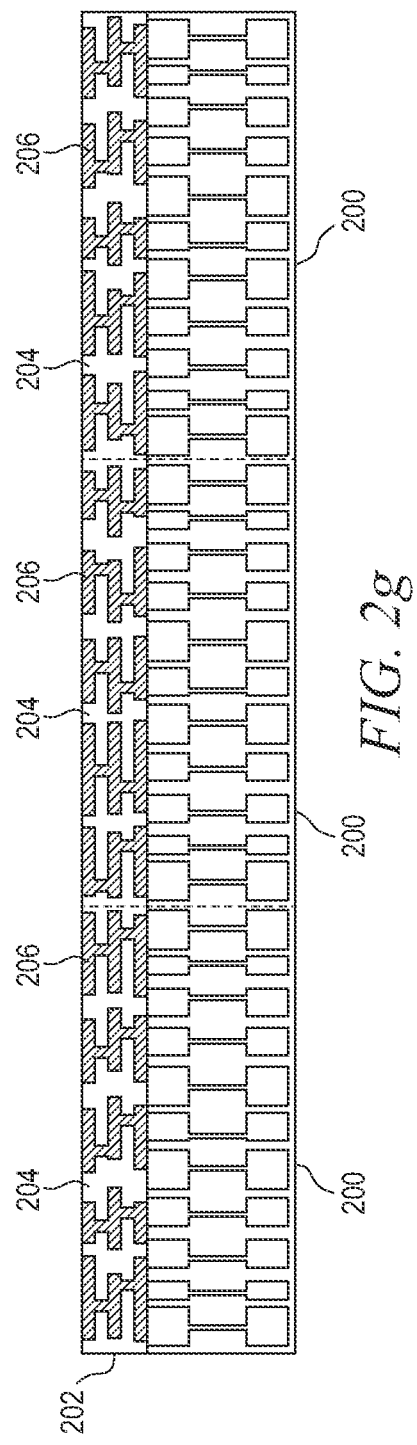

FIG. 2g shows a panel or sheet of antennae 200. In one embodiment, antennae 200 are dielectric resonator antennae (DRA). DRA are radio antennae commonly used at microwave frequencies and higher, consisting of a block of ceramic material of various shapes, the dielectric resonator, mounted on a metal surface that operates as a ground plane. Radio waves are introduced into the inside of the resonator material from the transmitter circuit and bounce back and forth between the resonator walls, forming standing waves. The walls of the resonator are partially transparent to radio waves, allowing the radio power to radiate into space. Any other suitable type of antenna is used for antennae 200 in other embodiments.

Figure 2H:
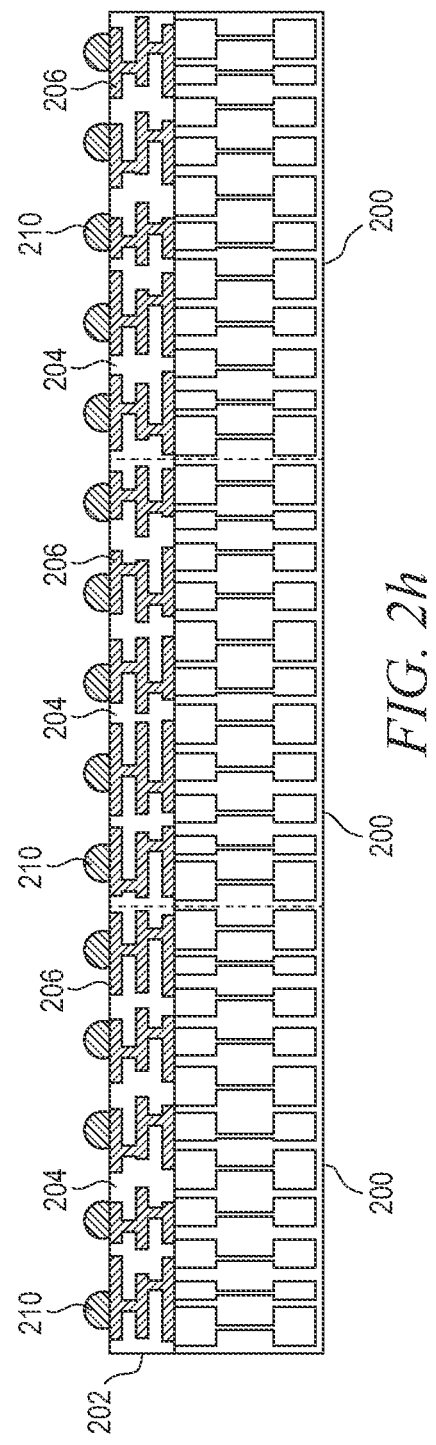

Antennae 200 are formed or disposed on a substrate 202 having a similar structure to substrate 152, with one or more conductive layers 206 interleaved between insulating layers 204. Any suitable type of substrate can be used for substrate 202, including those described above for substrate 152. In one embodiment, a ground plane for the antenna is formed in substrate 202. In FIG. 2h, bumps 210 are formed on substrate 202 opposite antenna 200 in a manner similar to the above description of bumps 114 being formed on semiconductor die 104. Other types of interconnect structures are used in other embodiments.

Figure 2I:
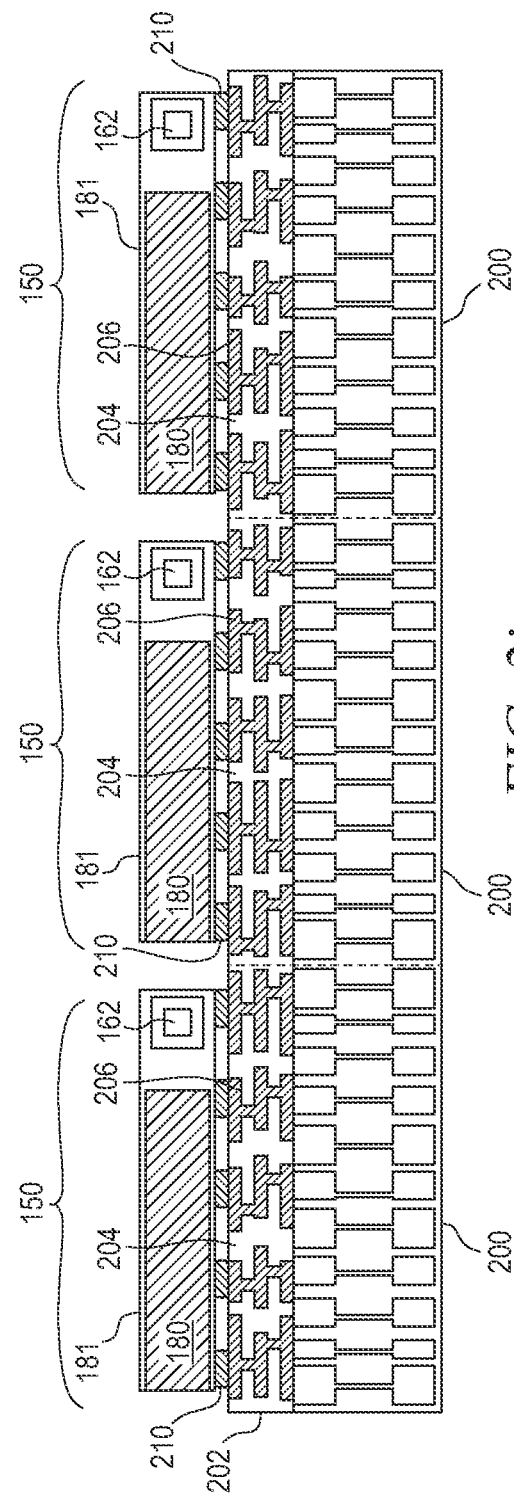
Figure 2J:
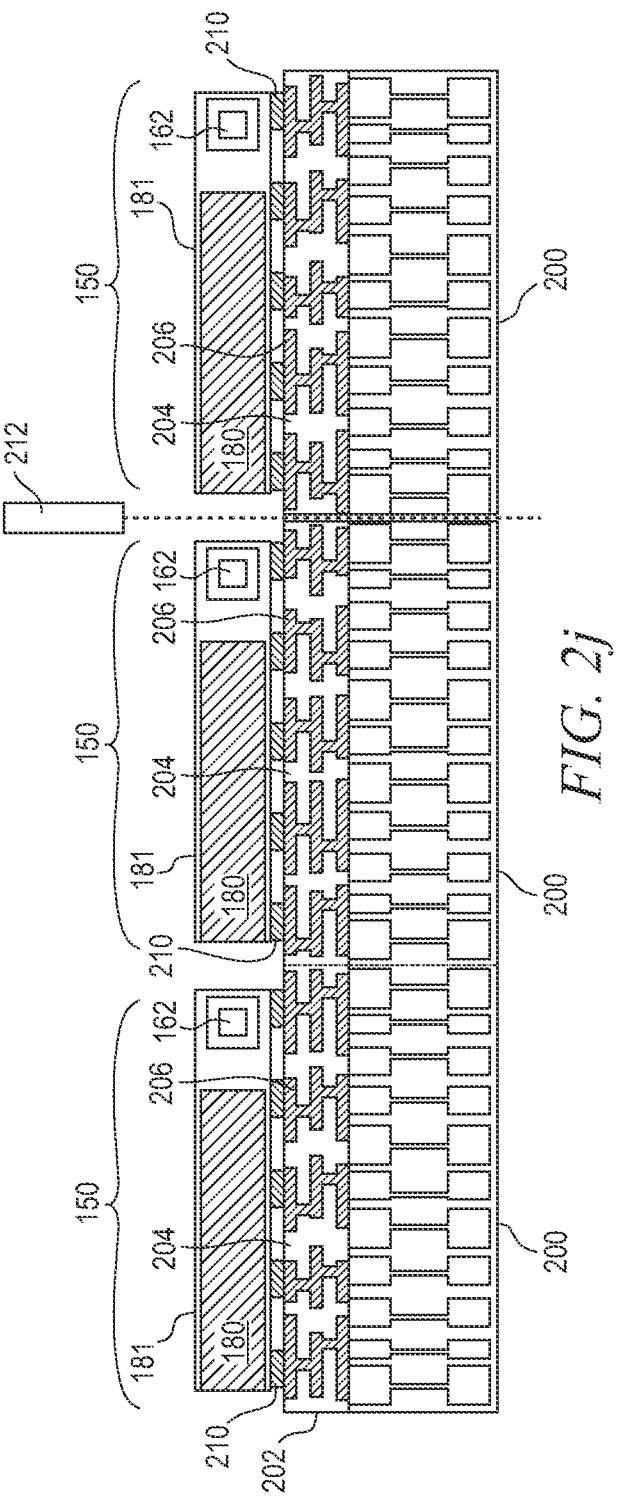

In FIG. 2i, construction of AiP 150 is continued by mounting subpackages 181 onto substrate 202 of antenna 200. Subpackages 181 are mounted with substrate 152 oriented perpendicularly to substrate 202. In other embodiments, the angle can be non-perpendicular. Bumps 210 are reflowed between conductive layer 206 of substrate 202 and contact pads 182 on surface 184 to electrically and mechanically connect substrate 152 to substrate 202. Other types of interconnect structures are used in other embodiments. Semiconductor die 104 are electrically coupled to antennae 200 through substrates 152 and 202. AiP 150 are singulated from each other by cutting through substrate 202 and antennae 200 using a laser cutting tool 212, a saw blade, or another suitable mechanism in FIG. 2j to complete the integrated AiP structures.

Substrate 152 is oriented perpendicularly to substrate 202, which allows a main board to easily connect to B2B connector 162 via a corresponding B2B connector directly mounted onto the main board, while antenna 200 remains oriented perpendicularly to the main board. AiP 150 is an integrated 5g antenna-in-package structure that is easily integrated into any mobile device design, connects to the mobile device's main board via B2B connector 162, and provides a perpendicularly oriented antenna as desired for advanced 5G communication protocols. Mounting substrate 152 with semiconductor die 104 directly to substrate 202 of antenna 200 perpendicularly saves having to utilize a flexible substrate to orient the two portions perpendicular to each other, greatly reducing cost and complexity of manufacturing AiP 150 compared to the prior art.

FIGS. 3a-3c illustrate forming an AiP 220 with the side contacts being formed using a metal bar 222 to form contact pads on the side subpackage 224 rather than embedding conductive material within the substrate as with subpackage 181. FIG. 3a shows two AiP 220 units being formed back-to-back sharing a metal bar 222 between the two units. Metal bar 222 extends across a saw street between the units so that, after singulation through the metal bar, a portion of the metal bar remains exposed at a side surface of encapsulant 176 of each unit as shown in FIG. 3b.

Metal bar 222 is disposed directly on conductive layer 156 to provide electrical connection to semiconductor die 104. Metal bar 222 is optionally soldered onto substrate 152 or attached using a conductive adhesive. Shielding layer 180 can optionally be used with metal bar 222.

FIG. 3c shows completion of AiP 220 by attaching subpackage 224 to substrate 202 via metal bar 222 and solder bump 210. Metal bar 222 operates as a contact pad exposed at a side surface of subpackage 224. However, metal bar 222 is disposed on substrate 152 rather than being embedded within or formed on a side surface of substrate 152 as in subpackage 181. In other embodiments, a contact pad on the side surface of a submodule extends vertically across both substrate 152 and encapsulant 176 rather than being contained only within one or the other.

Figure 4:
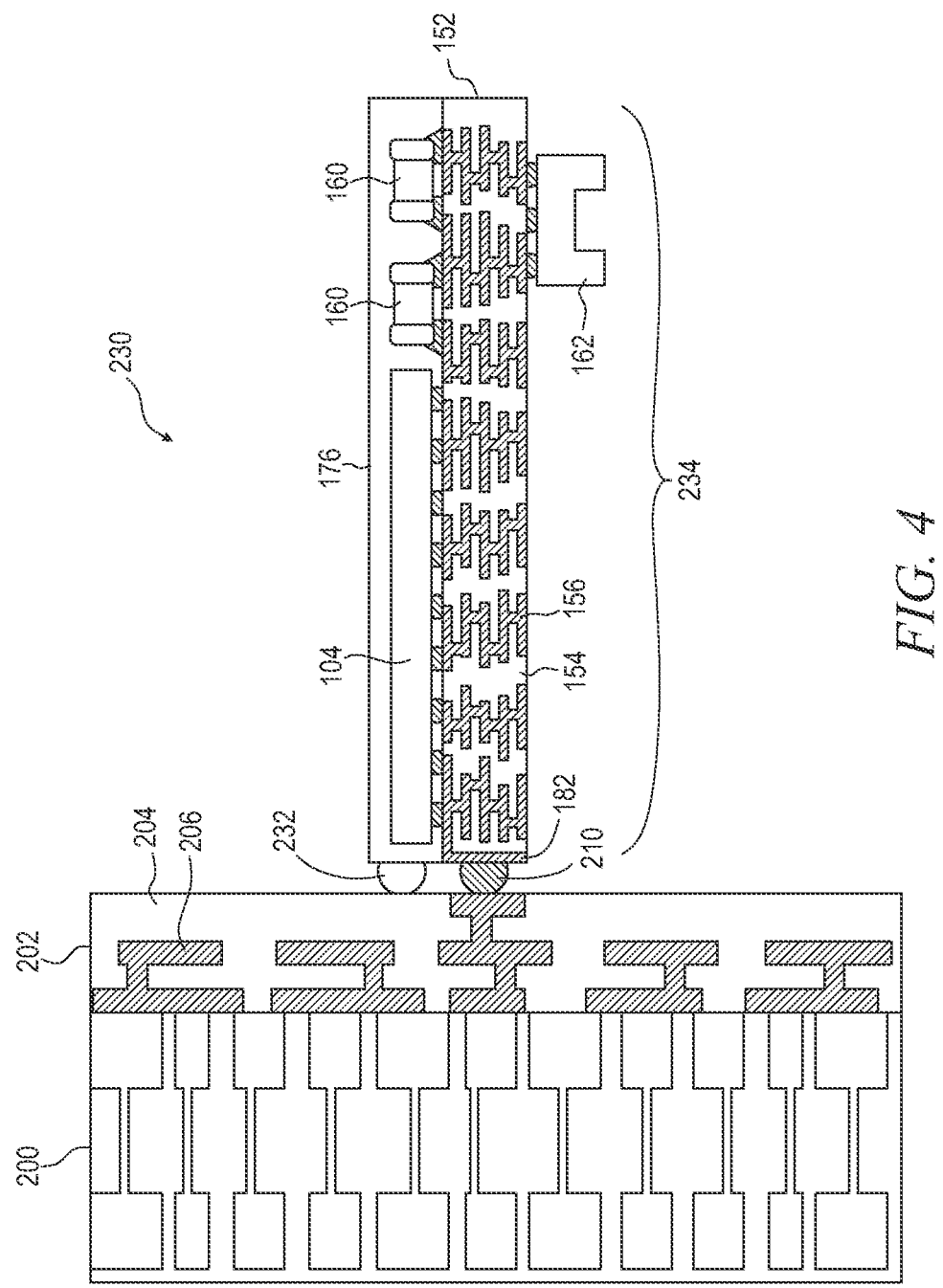
FIG. 4 illustrates additional features.

FIG. 4 shows an AiP 230 with additional features that can be independently used with any of the above-described embodiments. An adhesive or epoxy bead or bump 232 is disposed between subpackage 234 and substrate 202. Epoxy 232 is dispensed onto either substrate 202 along with bumps 210 or onto subpackage 234. Epoxy 232 may physically contact, and even completely surround, bumps 210 in some embodiments.

Epoxy 232 stabilizes the physical connection between subpackage 234 and antenna 200 by providing physical contact points along an extra axis as compared to just solder bumps 210 that are all oriented in a line together. Epoxy 232 can be added to any of the above embodiments to improve stability. In embodiments with metal bar 222 embedded in encapsulant 176 instead of contact pad 182 formed on a side surface of substrate 152, epoxy 232 is disposed between substrate 152 and substrate 202 instead of between encapsulant 176 and substrate 202 as illustrated in FIG. 4. Epoxy 232 is usable in any of the above embodiments, with or without shielding layer 180.

Also shown in FIG. 4, B2B connector 162 is placed on the opposite side of substrate 152 from semiconductor die 104 and other electrical components. In other embodiments, electrical components are mounted on both sides of substrate 152. B2B connector 162 on the bottom of substrate 152 can be used with contact pads 182 or metal bar 222, with or without epoxy 232, and with or without shielding layer 180.

Figure 5A:
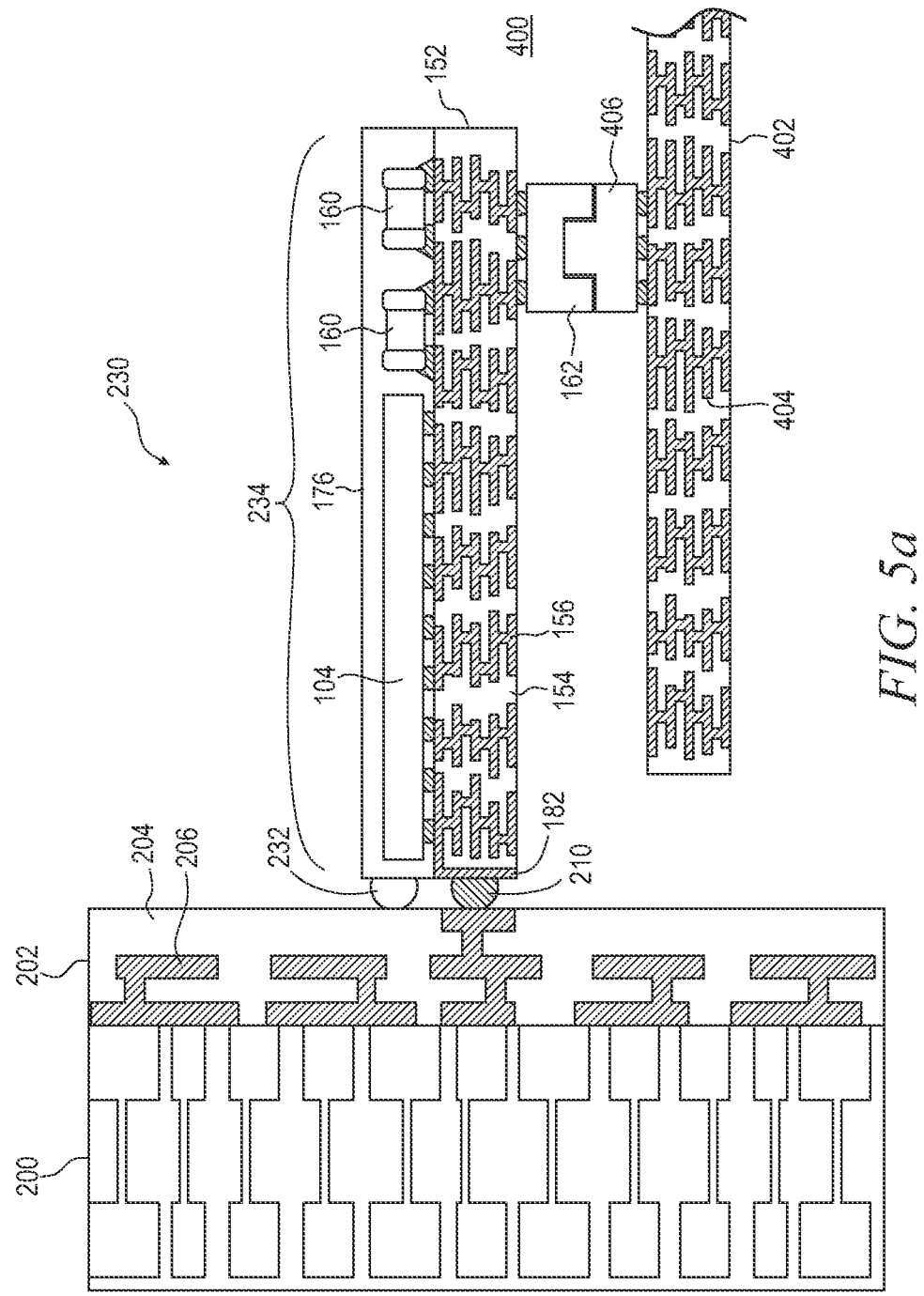
FIGS. 5a and 5b illustrate an electronic device with the AiP.
Figure 5B:
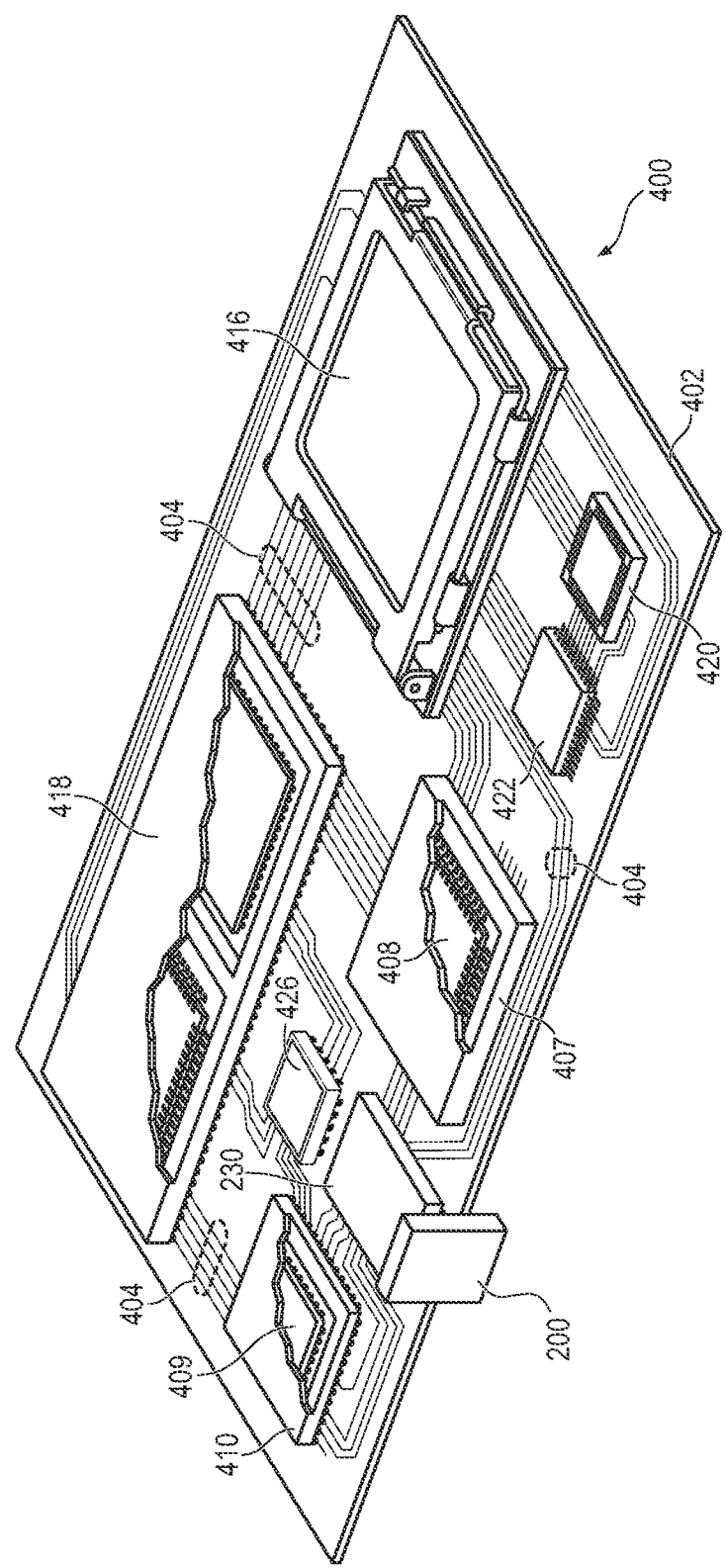

FIGS. 5a and 5b illustrate integrating the above-described semiconductor packages, e.g., AiP 230, into a larger electronic device 400. FIG. 5a illustrates a partial cross-section of AiP 230 mounted onto a printed circuit board (PCB) or other substrate 402 as part of electronic device 400. In one embodiment, electronic device 400 is a mobile phone and PCB 402 is the main board of the phone. AiP 230 is mounted by interfacing B2B connector 162 on PCB 152 with a corresponding B2B connector 406 on PCB 402. In some embodiments, AiP 230 is sufficiently secured by B2B connectors 162 and 406 snapping together. In other embodiments, an adhesive or other support mechanism is disposed between substrate 152 and PCB 402. When semiconductor die 104 and encapsulant 176 are disposed on the bottom of substrate 152, the encapsulant can physically contact PCB 402 to physically support AiP 230 on the PCB. Semiconductor die 104 is electrically coupled to PCB 402 through substrate 152 and B2B connectors 162 and 406.

FIG. 5b illustrates electronic device 400 including PCB 402 with a plurality of semiconductor packages mounted on a surface of the PCB, including AiP 230. Electronic device 400 can have one type of semiconductor package, or multiple types of semiconductor packages, depending on the application. Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 5b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 408 and flipchip 409, are shown on PCB 402. Additionally, several types of second level packaging, including ball grid array (BGA) 410, bump chip carrier (BCC) 407, land grid array (LGA) 416, multi-chip module (MCM) 418, quad flat non-leaded package (QFN) 420, quad flat package 422, and embedded wafer level ball grid array (eWLB) 426 are shown mounted on PCB 402 along with AiP 230. Conductive traces 404 electrically couple the various packages and components disposed on PCB 402 to AiP 230, giving use of the components within AiP 230 to other components on the PCB.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
   a first substrate;
   an electrical component disposed over the first substrate;
   a board-to-board connector disposed over the first substrate;
   an encapsulant deposited over the first substrate and electrical component to form a subpackage, wherein the board-to-board connector remains exposed from the encapsulant;
   a contact pad formed on a side surface of the subpackage; and
   an antenna mounted to the subpackage by a solder bump extending from the contact pad to the antenna.

2. The semiconductor device of claim 1, further including an adhesive disposed between the subpackage and antenna.

3. The semiconductor device of claim 1, wherein the antenna includes a second substrate, and wherein the antenna is mounted to the subpackage with the first substrate oriented perpendicular to the second substrate.

4. The semiconductor device of claim 1, wherein the electrical component is disposed over a first surface of the first substrate and the board-to-board connector is disposed over a second surface of the first substrate opposite the first surface.

5. The semiconductor device of claim 1, wherein the contact pad is embedded in the encapsulant.

6. The semiconductor device of claim 1, wherein the contact pad is embedded in the substrate.

7. A semiconductor device, comprising:
   a first substrate including a board-to-board connector mounted to the first substrate;
   an antenna including a second substrate mounted to the first substrate; and
   a solder bump extending from the first substrate to the second substrate.

8. The semiconductor device of claim 7, further including an adhesive disposed between the first substrate and second substrate.

9. The semiconductor device of claim 7, wherein the first substrate is oriented perpendicular to the second substrate.

10. The semiconductor device of claim 7, further including a mobile device comprising a main board, wherein the first substrate is connected to the main board through the board-to-board connector.

11. The semiconductor device of claim 7, further including a contact pad formed on a side surface of the first substrate, wherein the second substrate is connected to the first substrate through the contact pad.

12. The semiconductor device of claim 7, further including a contact pad disposed over a surface of the first substrate, wherein the second substrate is connected to the first substrate through the contact pad.

13. A method of making a semiconductor device, comprising:
   providing a first substrate;
   disposing an electrical component over the first substrate;
   disposing a board-to-board connector over the first substrate;
   depositing an encapsulant over the first substrate and electrical component to form a subpackage, wherein the board-to-board connector remains exposed from the encapsulant;
   forming a contact pad on a side surface of the subpackage;
   providing an antenna; and
   mounting the subpackage to the antenna through a solder bump reflowed between the contact pad and antenna.

14. The method of claim 13, further including disposing an adhesive between the subpackage and antenna.

15. The method of claim 13, wherein the antenna includes a second substrate, and wherein the subpackage is mounted to the antenna with the first substrate oriented perpendicular to the second substrate.

16. The method of claim 13, further including:
disposing the electrical component over a first surface of the first substrate; and
disposing the board-to-board connector over a second surface of the first substrate opposite the first surface.

17. The method of claim 13, further including forming the contact pad by:
disposing a metal bar over the first substrate; and
singulating through the metal bar and first substrate.

18. The method of claim 13, further including forming the contact pad by:
forming a conductive via in the first substrate; and
singulating the substrate through the conductive via.

19. A method of making a semiconductor device, comprising:
providing a first substrate including a board-to-board connector mounted to the first substrate;
providing an antenna including a second substrate; and
mounting the first substrate to the second substrate by reflowing a solder bump between the first substrate and second substrate.

20. The method of claim 19, further including disposing an adhesive between the first substrate and second substrate.

21. The method of claim 19, further including mounting the first substrate to the second substrate with the first substrate oriented perpendicular to the second substrate.

22. The method of claim 19, further including mounting the first substrate to a main board of a mobile device using the board-to-board connector.

23. The method of claim 19, further including forming a contact pad on a side surface of the first substrate by:
forming a conductive via in the first substrate; and
singulating the substrate through the conductive via.

24. The method of claim 19, further including forming a contact pad by:
disposing a metal bar over the first substrate; and
singulating the first substrate and metal bar.

25. The method of claim 19, further including disposing an electrical component over the substrate opposite the board-to-board connector.

\* \* \* \* \*